(12) United States Patent
Xiao et al.

(10) Patent No.: US 8,704,227 B2
(45) Date of Patent: Apr. 22, 2014

(54) LIGHT EMITTING DIODE AND FABRICATION METHOD THEREOF

(75) Inventors: Deyuan Xiao, Shanghai (CN); Richard Rugin Chang, Shanghai (CN); Mengjan Cherng, Shanghai (CN); Chijen Hsu, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 0 days.

(21) Appl. No.: 13/059,399

(22) PCT Filed: Dec. 30, 2010

(86) PCT No.: PCT/CN2010/080489
§ 371 (c)(1),
(2), (4) Date: Feb. 16, 2011

(87) PCT Pub. No.: WO2012/048506
PCT Pub. Date: Apr. 19, 2012

(65) Prior Publication Data
US 2013/0193406 A1 Aug. 1, 2013

(30) Foreign Application Priority Data

Oct. 15, 2010 (CN) .......................... 2010 1 0508108

(51) Int. Cl.
*H01L 29/04* (2006.01)
(52) U.S. Cl.
USPC .......................................................... 257/49

(58) Field of Classification Search
USPC ............................................................ 257/49
See application file for complete search history.

(56) References Cited

U.S. PATENT DOCUMENTS 6,921,924 B2 * 7/2005 Tsai et al. ........................ 257/95
2009/0186435 A1 * 7/2009 Yeh et al. ......................... 438/29

FOREIGN PATENT DOCUMENTS

CN 101582479 A 11/2009

* cited by examiner

*Primary Examiner* — Howard Weiss
*Assistant Examiner* — Steven Rao
(74) *Attorney, Agent, or Firm* — Blakely Sokoloff Taylor & Zafman

(57) ABSTRACT

The present invention discloses an LED and its fabrication method. The LED comprises: a sapphire substrate; an epitaxial layer, an active layer and a capping layer arranged on the sapphire substrate in sequence; wherein a plurality of cone-shaped structures are formed on the surface of the sapphire substrate close to the epitaxial layer. The cone-shaped structures can increase the light reflected by the sapphire substrate, raising the external quantum efficiency of the LED, thus increasing the light utilization rate of the LED. Furthermore, the formation of a plurality of cone-shaped structures can improve the lattice matching between the sapphire substrate and other films, reducing the crystal defects in the film formed on the sapphire substrate, increasing the internal quantum efficiency of the LED.

20 Claims, 5 Drawing Sheets

US 8,704,227 B2

LIGHT EMITTING DIODE AND FABRICATION METHOD THEREOF

This is a non-provisional application claiming the benefit of International Application No. PCT/CN2010/080489 filed Dec. 30, 2010.

BACKGROUND OF THE INVENTION

1. Technical Field

The present invention relates to the light emitting field, and more especially, to a light emitting diode and its fabrication method.

2. Description of Related Art

Light Emitting Diode (LED), having the advantages of long service life, low energy consumption and others, is widely used in various fields. In particular, with the greatly improved lighting performance, LED is often used as a light emitting device in lighting field. Wherein, the group III-V compound semiconductors such as gallium nitride (GaN), has tremendous application potential in high-brightness blue LED, blue laser and other photoelectric devices due to its wide band gap, high light emitting efficiency, high electronic saturation drift velocity, stable chemical property and other characteristics, which has aroused wide attention.

However, those semiconductor LEDs in the prior art have the problem of low light emitting efficiency. For a conventional LED without packaging, the light extraction efficiency is generally several percent, because a large amount of energy gathers in the device and fails to give out, thus causing energy waste and also affecting the service life of the device. Therefore, to improve the light extraction efficiency of a semiconductor LED is of vital importance.

Based on the abovementioned application demands, many methods for increasing the light extraction efficiency of an LED are applied to the devices, for instance: surface roughening and metal reflector structures.

CN 1858918A discloses a GaN-based LED with an omnidirectional reflector structure and its fabrication method. According to FIG. 1, the LED comprises: a substrate 1, an omnidirectional reflector 4 grown on the substrate 1, and a GaN LED chip 13 fabricated on the omnidirectional reflector 4. The GaN LED chip 13 includes: a sapphire substrate 5, an N type GaN layer 6, an active region quantum well layer 7, a P type GaN layer 8, a P type electrode 9, a P type soldering pad 10, an N type electrode 11, and an N type soldering pad 12; wherein the omnidirectional reflector 4 grown on the substrate 1 is stacked by high refractive index layers 3 and low refractive index layers 2, the high refractive index layer 3 is in contact with the sapphire substrate 5, the low refractive index layer 2 is in contact with the substrate 1, the refractive index of the high refractive index layer nH>the refractive index of the low refractive index layer nL>the refractive index of the sapphire material n, and satisfies the formula of $$\sin^{-1}\frac{n}{nH} < \tan^{-1}\frac{nL}{nH},$$

wherein n, nH and nL represent refractive index. This patent forms an omnidirectional reflector structure on the bottom surface of the LED chip to reflect the light emitted by GaN material at a high refractive index upwards within the omnidirectional range so as to improve the light extraction efficiency of the LED. However, the fabrication process of the LED requires the forming of a film structure stacked by multiple high refractive index layers and low refractive index layers on the substrate, which is a complicated technique and the manufacturing cost is very high.

SUMMARY OF THE INVENTION

The present invention aims at providing a light emitting diode to solve the problem of low light extraction efficiency of the traditional light emitting diodes.

Another purpose of the present invention is to provide a fabrication method of light emitting diode with simple process and improves the light extraction efficiency of light emitting diodes.

To solve the abovementioned technical problems, the present invention provides a light emitting diode, the light emitting diode comprises: a sapphire substrate; an epitaxial layer, an active layer and a capping layer arranged on the sapphire substrate in sequence; wherein, a plurality of cone-shaped structures are formed on the surface of the sapphire substrate close to the epitaxial layer.

In the light emitting diode, the cone-shaped structures are rectangular pyramid structures with a square base and four isosceles triangle sides having the same dimension, adjacent rectangular pyramid structures share one edge, and the included angle between adjacent rectangular pyramid structures is 60~120 degrees.

In the light emitting diode, the cone-shaped structures are triangular pyramid structures, hexagonal pyramid structures, octagonal pyramid structures or circular cone structures.

In the light emitting diode, the light emitting diode further comprises a buffer layer between the sapphire substrate and the epitaxial layer. The light emitting diode further comprises a transparent conductive layer on the capping layer.

In the light emitting diode, the light emitting diode further comprises a first electrode, a second electrode, and an opening extending into the epitaxial layer, wherein, the first electrode is on the transparent conductive layer to connect the transparent conductive layer to the positive terminal of a power; the second electrode is in the opening to connect the epitaxial layer to the negative terminal of the power.

In the light emitting diode, the material of the epitaxial layer is N-doped gallium nitride; the active layer comprises a multiple-quantum-well active layer, the material of the multiple-quantum-well active layer is indium-gallium nitride; the material of the capping layer is P-doped gallium nitride.

Correspondingly, the present invention further provides a fabrication method of light emitting diode, which comprises: providing a sapphire substrate; etching the sapphire substrate to form a plurality of cone-shaped structures; forming an epitaxial layer, an active layer and a capping layer on the cone-shaped structures in sequence.

In the fabrication method of light emitting diode, the cone-shaped structures are rectangular pyramid structures with a square base and four isosceles triangle sides having the same dimension, adjacent rectangular pyramid structures share one edge, and the included angle between adjacent rectangular pyramid structures is 60~120 degrees.

In the fabrication method of light emitting diode, the cone-shaped structures are triangular pyramid structures, hexagonal pyramid structures, octagonal pyramid structures or circular cone structures.

In the fabrication method of light emitting diode, the step of forming a plurality of cone-shaped structures comprises: forming a plurality of photoresist blocks on the sapphire substrate; baking the photoresist blocks so that the surfaces of the photoresist blocks become arc-shaped or cone-shaped under force of surface tension at a temperature higher than the glass melting temperature of photoresist; performing inductive coupled plasma etch process by using the photoresist blocks after baking as mask until the photoresist blocks after baking are completely etched, wherein, the ratio between the etch rate of the sapphire substrate and the etch rate of the photoresist blocks after baking is in the range of 1~1.8.

In the fabrication method of light emitting diode, the cross section of the photoresist block has a shape of triangle, rectangle, hexagon, octagon or circle.

In the fabrication method of light emitting diode, in the inductive coupled plasma etch process, the etching gas is a mixture of boron trichloride, helium gas and argon gas, the cavity pressure is 50 mTorr~2 Torr, the plate power is 200 W~300 W, the coil power is 300 W~500 W.

In the fabrication method of light emitting diode, the photoresist blocks are baked under a temperature of 120~250.

In the fabrication method of light emitting diode, the material of the epitaxial layer is N-doped gallium nitride; the active layer comprises a multiple-quantum-well active layer, the material of the multiple-quantum-well active layer is indium-gallium nitride; the material of the capping layer is P-doped gallium nitride.

In the fabrication method of light emitting diode, before the formation of the epitaxial layer, further comprises: forming a buffer layer on the sapphire substrate; after the formation of the capping layer, further comprises: forming a transparent conductive layer on the capping layer.

In the fabrication method of light emitting diode, after the formation of the transparent conductive layer, further comprises: forming a first electrode on the transparent conductive layer; forming an opening extending into the epitaxial layer; forming a second electrode in the opening.

With the adoption of the technical solution above, compared with the prior art, the present invention has the following advantages:

The sapphire substrate of the LED has a plurality of cone-shaped structures on the surface close to the epitaxial layer. The cone-shaped structures can increase the light reflected by the sapphire substrate, raising the external quantum efficiency of the LED, thus increasing the light utilization rate of the LED. Furthermore, the formation of a plurality of cone-shaped structures can improve the lattice matching between the sapphire substrate and other films, reducing the crystal defects in the film formed on the sapphire substrate, increasing the internal quantum efficiency of the LED, and making sure that the device is unlikely to break. In addition, the fabrication method of light emitting diode of the present invention has simple manufacturing process and low manufacturing cost.

DETAILED DESCRIPTION OF THE INVENTION

To make the abovementioned purposes, features and merits of the present invention clearer and easier to understand, the present invention is further detailed by embodiments in combination with the drawings.

The core spirit of the present invention is to provide a light emitting diode, which comprises: a sapphire substrate; an epitaxial layer, an active layer and a capping layer arranged on the sapphire substrate in sequence; wherein the sapphire substrate has a plurality of cone-shaped structures on the surface close to the epitaxial layer. The cone-shaped structures can improve the light reflection, raising the external quantum efficiency of the LED, thus increasing the light utilization rate of the LED. Furthermore, the formation of a plurality of cone-shaped structures can improve the lattice matching between the sapphire substrate and other films, reducing the crystal defects in the film formed on the sapphire substrate, increasing the internal quantum efficiency of the LED, and making sure that the device is unlikely to break. In addition, the fabrication method of light emitting diode of the present invention has simple manufacturing process and low manufacturing cost.

Figure 1:
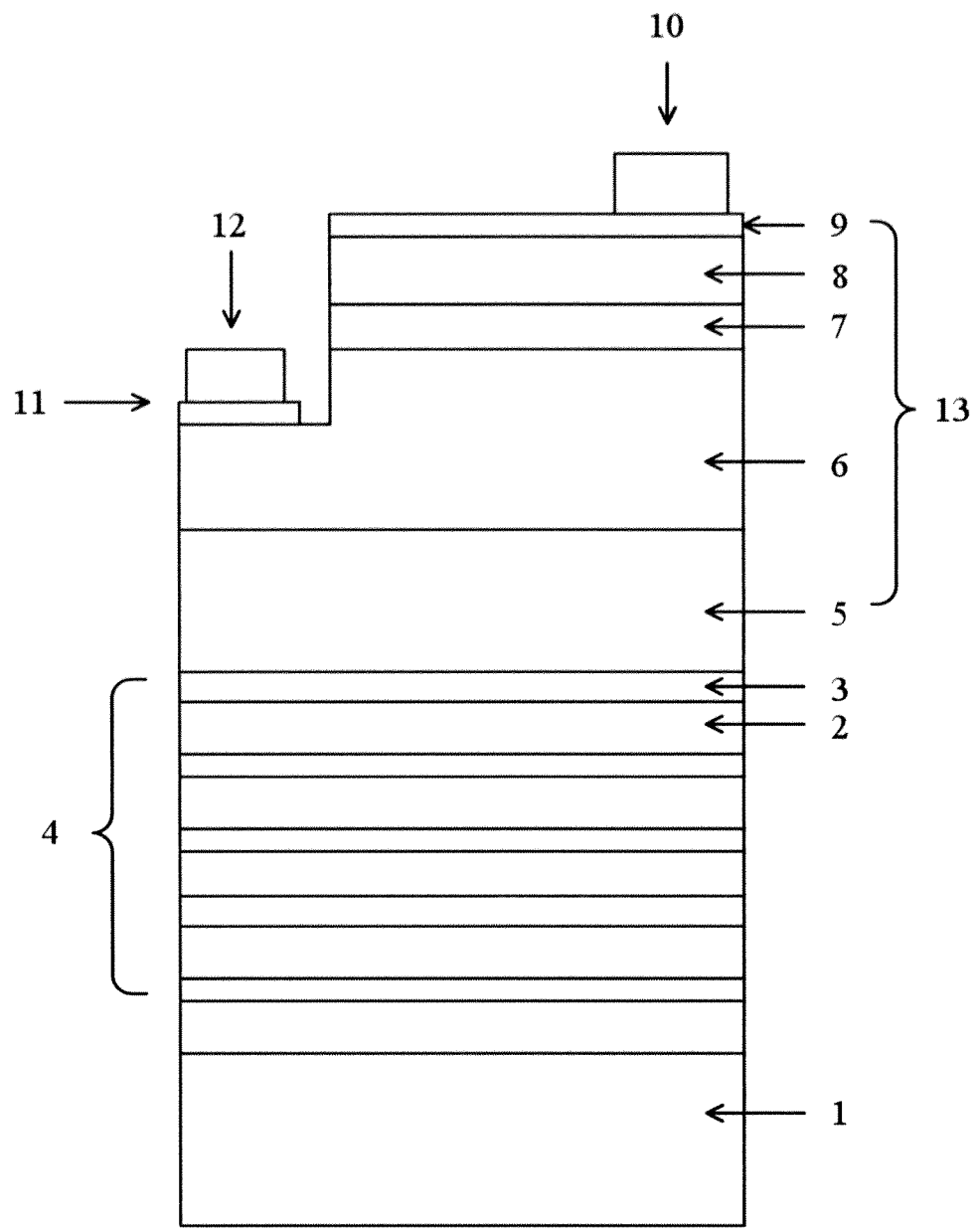
FIG. 1 is a schematic view of the LED in the prior art.
Figure 2:
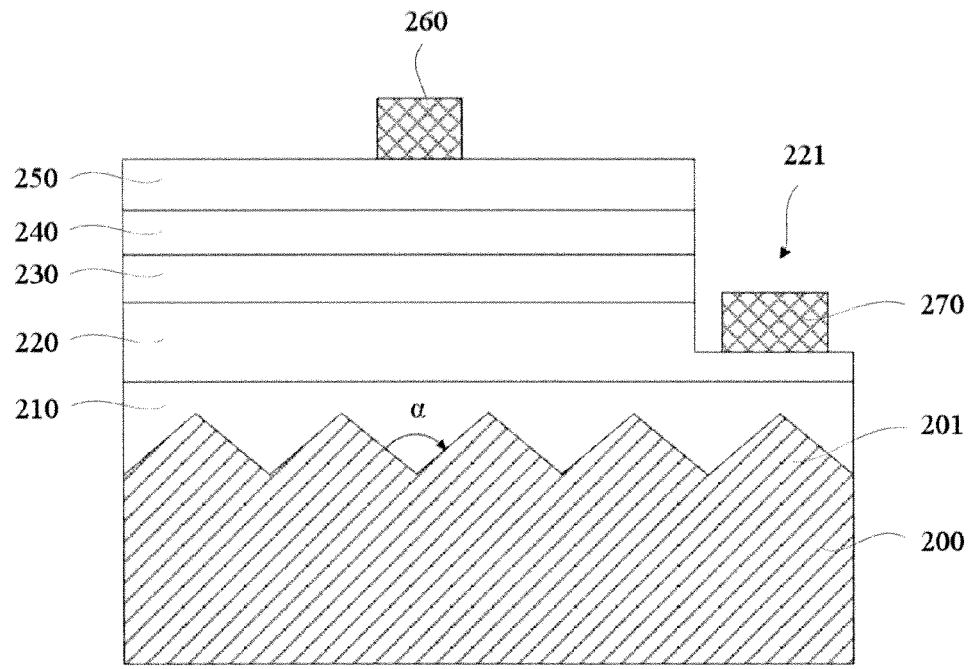
FIG. 2 is a schematic view of the LED according to one embodiment of the present invention.

FIG. 2 shows a schematic view of the light emitting diode (LED) according to one embodiment of the present invention. The LED is a light emitting diode with sapphire as the substrate. The LED is a gallium nitride (GaN)-based blue LED. As shown in FIG. 2, the LED comprises: a sapphire substrate 200, an epitaxial layer 220, an active layer 230 and a capping layer 240. The sapphire substrate 200 has a plurality of cone-shaped structures 201 on the surface close to the epitaxial layer 220. The cone-shaped structures 201 can modify the critical angle of total reflection, increasing the light reflected by the sapphire substrate 200, raising the external quantum efficiency of the LED, thus increasing the light utilization rate of the LED. Furthermore, the cone-shaped structures 201 can improve the lattice matching between the sapphire substrate 200 and other films (namely the buffer layer 210 in this embodiment), reducing the crystal defects in the buffer layer 210 formed on the sapphire substrate, increasing the internal quantum efficiency of the LED, and making sure that the device is unlikely to break.

Figure 3:
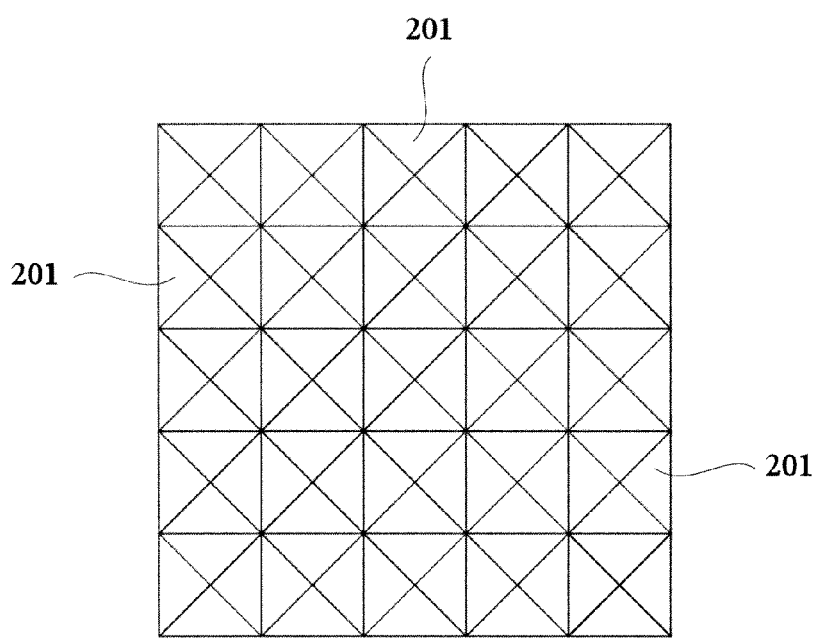
FIG. 3 is a top view of the cone-shaped structures according to one embodiment of the present invention.

As shown in FIG. 3, also refer to FIG. 2, in this embodiment, the cone-shaped structures 201 are preferably rectangular pyramid structures. The base of the rectangular pyramid structure is square, the four triangular faces of the rectangular pyramid structure are isosceles triangles having the same dimension, adjacent rectangular pyramid structures share one edge (in other words, the rectangular pyramid structures are in close contact with each other), and the included angle α between adjacent rectangular pyramid structures is 60~120 degrees, with such an angle, the sapphire substrate 200 has a better performance of light reflection so as to raise the external quantum efficiency of the LED to the greatest degree.

It shall be noted that the cone-shaped structures of the present invention are not limited to rectangular pyramid structures. In other embodiments of the present invention, the cone-shaped structures can adopt other shapes, such as triangular pyramid structures, hexagonal pyramid structures, octagonal pyramid structures or circular cone structures. The included angle between adjacent cone-shaped structures may also be adjusted correspondingly.

Furthermore, the LED further comprises a buffer layer 210 which is between the sapphire substrate 200 and the epitaxial layer 220; the buffer layer 210 can further solve the problem of lattice constant mismatch between the sapphire substrate 200 and gallium nitride material. The buffer layer 210 generally adopts gallium nitride film grown under low temperature.

Wherein, the epitaxial layer 220, the active layer 230 and the capping layer 240 are arranged on the sapphire substrate 200 in sequence. The epitaxial layer 220, the active layer 230 and the capping layer 240 form the tube core of the LED. Wherein, the epitaxial layer 220 is made of N-doped gallium nitride (n-GaN); the active layer 230 includes a multiple-quantum-well active layer, wherein the multiple-quantum-well active layer is made of indium-gallium nitride (InGaN) to emit blue light with wave length of 470 nm; the capping layer 240 is made of P-doped gallium nitride (p-GaN). Since the epitaxial layer 220 and the capping layer 240 are oppositely doped, the N-doped gallium nitride is driven by an external voltage to make electrons drift, while the P-doped gallium nitride is driven by the external voltage to make holes drift, the holes and the electrons are mutually combined in the multiple-quantum-well active Layer (also known as active layer) so as to emit light.

Furthermore, the LED further comprises a transparent conductive layer (TCL) 250, wherein the transparent conductive layer 250 is on the capping layer 240. Since the P-doped gallium nitride has a low electric conductivity, a current spreading metal layer, namely the transparent conductive layer 250, is deposited on the surface of the capping layer 240 to raise the electric conductivity. Wherein, the transparent conductive layer 250 can be made of such materials as nickel/gold (Ni/Au).

In addition, since the sapphire substrate 200 does not conduct electricity, in order to connect the tube core of the LED to the positive and negative terminals of the power, the LED further comprises a first electrode 260, a second electrode 270, and an opening 221 whose depth is extended into the epitaxial layer 220; wherein the first electrode 260 is on the transparent conductive layer 250 to connect the transparent conductive layer 250 to the positive terminal of the power; the second electrode 270 is in the opening 221 to connect the epitaxial layer 220 to the negative terminal of the power.

When the LED is used for light emitting, the first electrode 260 is connected to the positive terminal of the power, the second electrode 270 is connected to the negative terminal of the power, the tube core of the LED is connected to the positive terminal of the power via the first electrode 260, and is connected to the negative terminal of the power via the second electrode 270. The active layer 230 in the tube core of the LED emits light under force of current, the cone-shaped structures 201 increase the light reflection, in this way improving the external quantum efficiency of the LED.

Figure 4:
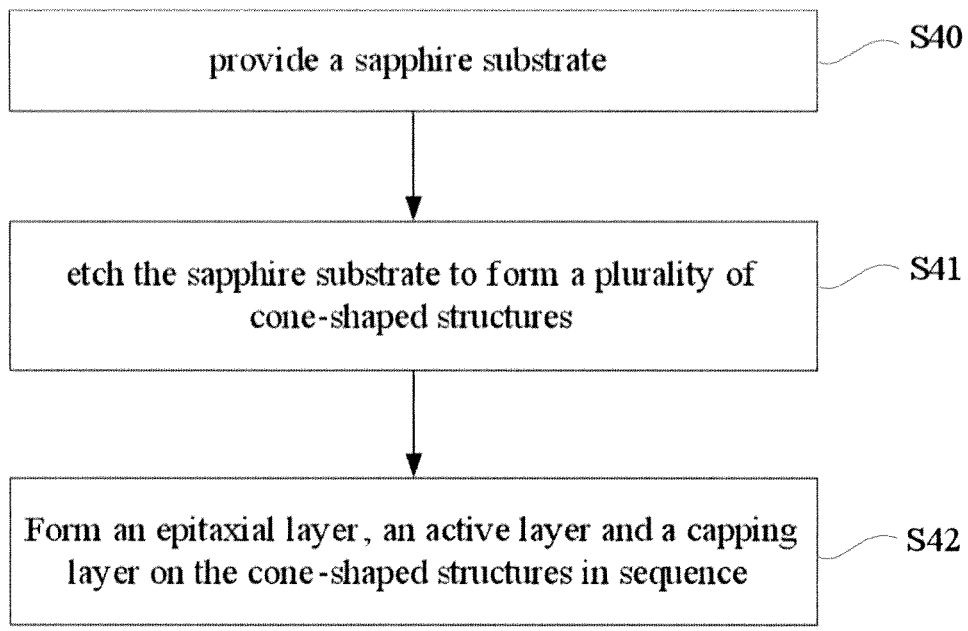
FIG. 4 is a flow chart of the fabrication method of LED according to one embodiment of the present invention.

Correspondingly, the present invention further provides a fabrication method of LED, as shown in FIG. 4, which is a flow chart of the fabrication method of LED according to one embodiment of the present invention. The fabrication method of LED comprises the following steps:

S40, provide a sapphire substrate;

S41, etch the sapphire substrate to form a plurality of cone-shaped structures;

S42, form an epitaxial layer, an active layer and a capping layer on the cone-shaped structures in sequence.

The fabrication method of LED of the present invention will be further detailed in combination with the sectional views, which show a preferred embodiment of the present invention. It shall be understood that those skilled in the art may make changes while still realize the favorable effects of the invention based on this description. Therefore, the description below shall be understood as widely known by those skilled in the art rather than the limitation to the present invention.

Figure 5A:
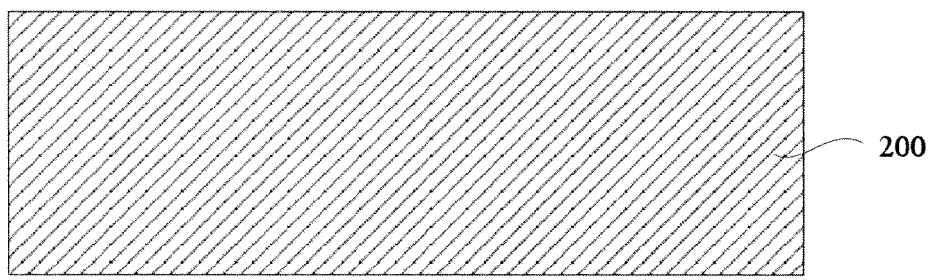
FIG. 5A~5E are sectional views of the fabrication method of LED according to one embodiment of the present invention.

Refer to FIG. 5A, firstly provide a sapphire substrate 200, wherein the sapphire substrate 200 is made of $Al_2O_3$. According to this embodiment, the sapphire substrate 200 is used to form a gallium nitride based blue LED.

Figure 5B:
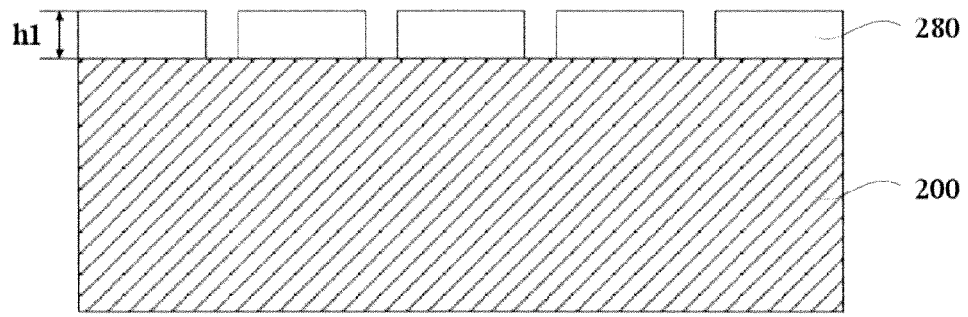
Figure 6:
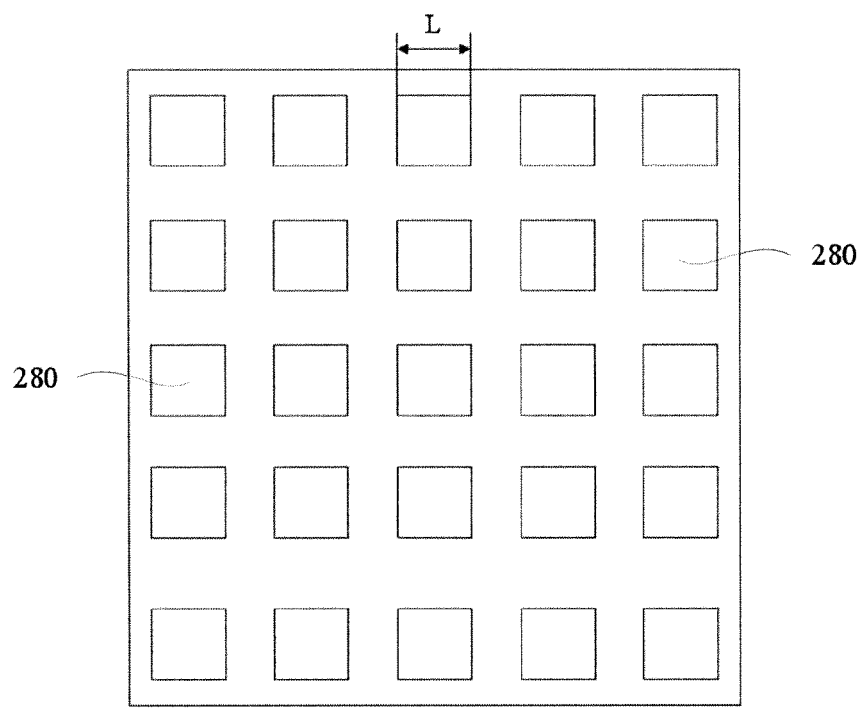
FIG. 6 is a top view of the rectangular pyramid photoresist blocks according to one embodiment of the present invention.

Refer to FIG. 5B, next, form a plurality of photoresist blocks 280 on the sapphire substrate 200 by photoresist coating, exposing and developing processes. In this embodiment, as shown in FIG. 5B and FIG. 6, the photoresist block refers to a quadrangular photoresist block, namely the cross section (the section in the direction parallel to the sapphire substrate) of the photoresist block 280 is rectangular, preferably square. The photoresist blocks 280 have a thickness h1 of for example 0.1 μm~5 μm and a base edge length L of for example 0.1 μm~5 μm. The photoresist blocks 280 are arranged in array on the sapphire substrate 200, preferably, the photoresist blocks 280 are equally spaced. It shall be understood that those skilled in the art may adjust the shape of the photoresist blocks according to the desired shape of the cone-shaped structures. For instance, the cross section of the photoresist block can also be triangular, hexagonal, octagonal or circular.

Figure 5C:
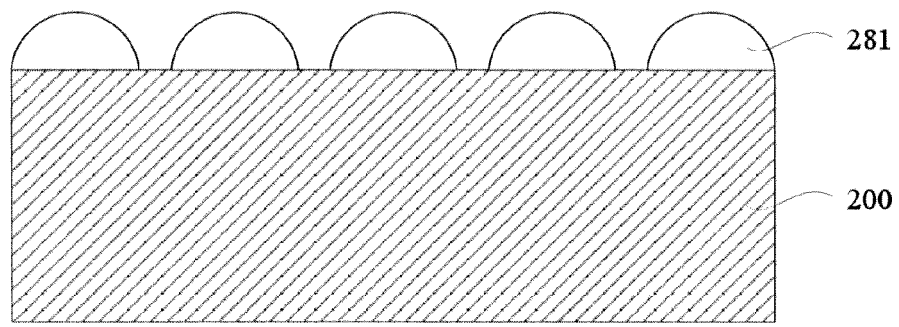

Refer to FIG. 5C, afterwards, bake the photoresist blocks 280 to enable the photoresist blocks 280 melting and reflow, and turn into photoresist blocks after baking 281.

Alternatively, the photoresist blocks 280 are baked under the temperature of 120° C.~250° C. The surfaces of the photoresist blocks 280 become arc-shaped or cone-shaped under force of surface tension at a temperature higher than the glass melting temperature of photoresist. In detail, if the photoresist block is a cylindrical photoresist block, the cylindrical photoresist block after baking will turn into a spherical-crown shape; if the cross section of the photoresist block is in a shape of triangle or rectangle or other polygons, the surface of the photoresist block after baking will become pyramid shaped (the photoresist block after baking having a larger bottom size and a smaller top size).

Figure 5D:
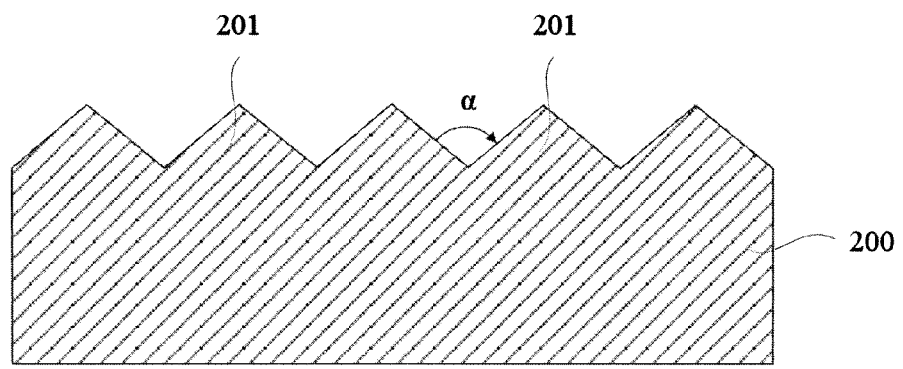

Refer to FIG. 5D, next, perform inductive coupled plasma (ICP) etch process by using the photoresist blocks after baking 281 as mask until the photoresist blocks after baking 281 are completely etched so as to form a plurality of cone-shaped structures 201 on the surface of the sapphire substrate 200 close to the epitaxial layer. In the inductive coupled plasma etch process, the ratio between the etch rate of the sapphire substrate and the etch rate of the photoresist blocks after baking can be controlled into the range of 1~1.8 so as to form a plurality of cone-shaped structures. In this embodiment, the cone-shaped structures 201 are preferably rectangular pyramid structures. The base of the rectangular pyramid structure is square, the four triangular faces of the rectangular pyramid structure are isosceles triangles having the same dimension, adjacent rectangular pyramid structures share one edge, and the included angle α between adjacent rectangular pyramid structures is 60~120 degrees. The height of the cone-shaped structures 201 can be 0.1 μm~5 μm.

In this embodiment, the etching selection ratio in the inductive coupled plasma etch process can be controlled to 1~1.8 by setting a plate power higher than the coil power. However, the present invention shall not be limited to this. The etching selection ratio in the inductive coupled plasma etch process can also be controlled by controlling other parameters of the etch process.

Furthermore, in the inductive coupled plasma etch process, the etching gas can be a mixture of boron trichloride ($BCl_3$), helium gas (He) and argon gas (Ar); the cavity pressure can be 50 mTorr~2 Torr, the plate power is 400 W~600 W and the coil power is 300 W~500 W.

It shall be noted that the description above does not constitute limitation to the present invention. Those skilled in the art may regulate the etching gas and various technical parameters as well as the etching selection ratio according to the real-life conditions of the etching machine so as to form cone-shaped structures 201 on the sapphire substrate 200.

Figure 5E:
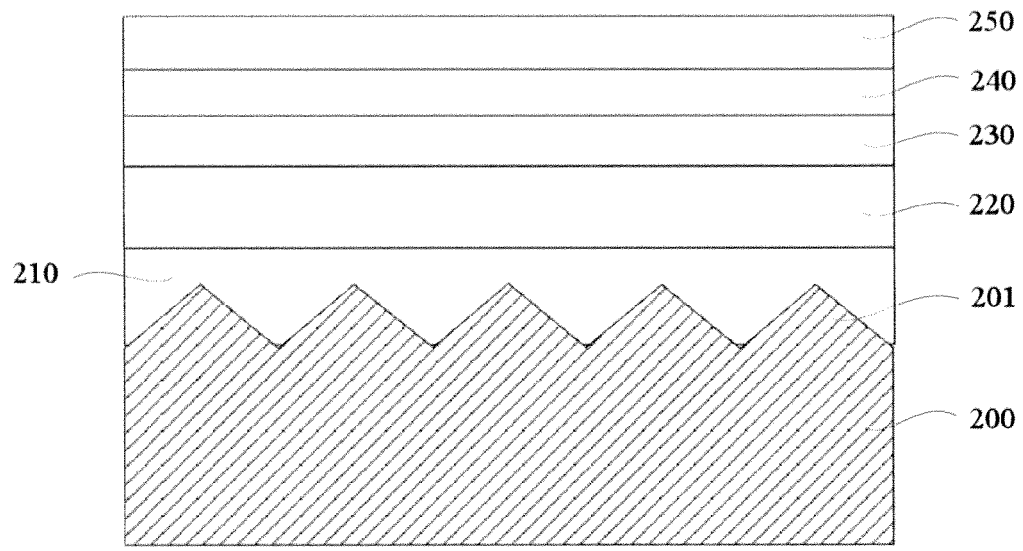

Refer to FIG. 5E, in order to solve the problem of lattice constant mismatch between the sapphire substrate 200 and gallium nitride material, then, form a buffer layer 210 on the sapphire substrate 200 having a plurality of cone-shaped structures 201, wherein the buffer layer 210 generally adopts gallium nitride film grown under low temperature. The buffer layer 210 covers all of the cone-shaped structures.

After the formation of the buffer layer 210, form an epitaxial layer 220, an active layer 230 and a capping layer 240 on the buffer layer 210 in sequence, wherein the epitaxial layer 220, the active layer 230 and the capping layer 240 constitute the tube core of the LED. The epitaxial layer 220 is made of N-doped gallium nitride; the active layer 230 includes a multiple-quantum-well active layer, wherein the multiple-quantum-well active layer is made of indium-gallium nitride; the capping layer 240 is made of P-doped gallium nitride.

After the formation of the capping layer 240, form a transparent conductive layer 250 on the capping layer 240. The transparent conductive layer 250 is used to raise the electric conductivity. The transparent conductive layer 250 can be made of Ni/Au. The buffer layer 210, the epitaxial layer 220, the active layer 230, the capping layer 240 and the transparent conductive layer 250 can be formed by means of conventional metal organic chemical vapor deposition (MOCVD) process.

Refer to FIG. 2 again, finally, form a first electrode 260 on the transparent conductive layer 250 to connect the transparent conductive layer 250 to the positive terminal of the power; and then form an opening 221, whose depth is extended into the eptaxial layer 220 by means of photolithography and etch, namely etch the transparent conductive layer 250, the capping layer 240, the active layer 230 and part of the eptaxial layer 220 in sequence. After that, form a second electrode 270 in the opening 221 to connect the epitaxial layer 220 to the negative terminal of the power, so that a light emitting diode as shown in FIG. 2 is completed.

It shall be noted that, the blue LED in the abovementioned embodiment is taken as an example, but this does not constitute limitation to the present invention, the above embodiment can also be applied to red LED, yellow LED. Those skilled in the art may make modification, replacement and deformation to the present invention according to the embodiment above.

To sum up, the present invention provides an LED and its fabrication method, wherein the sapphire substrate of the LED has a plurality of cone-shaped structures on the surface close to the epitaxial layer. The cone-shaped structures can on one hand improve the light reflection, raising the external quantum efficiency of the LED, thus increasing the light utilization rate of the LED; on the other hand, the cone-shaped structures can improve the lattice matching between the sapphire substrate and other films, reducing the crystal defects in the film formed on the sapphire substrate, increasing the internal quantum efficiency of the LED, and making sure that the device is unlikely to break. In addition, compared with the prior art, the present invention has simpler LED manufacturing process and lower manufacturing cost.

It is clear that those skilled in the art may make various changes and deformations without deviating from the spirit and protection scope of the present invention. If such changes and deformations are within the scope of the claims and the equivalent technological scope, the present invention is also intended to include these changes and deformations.

What is claimed is:

1. A light emitting diode, comprising:
a sapphire substrate;
an epitaxial layer, an active layer and a capping layer arranged on the sapphire substrate in sequence;
wherein, a plurality of cone-shaped structures are regularly and uniformly formed on a surface of the sapphire substrate close to the epitaxial layer facing the active layer to enhance the reflection of light, such that most light originally emitted from the active layer towards a bottom surface of the light emitting diode reversed its direction and is emitted from a top surface of the light emitting diode.

2. The light emitting diode as claimed in claim 1, wherein, the cone-shaped structures are rectangular pyramid structures.

3. The light emitting diode as claimed in claim 2, wherein, the rectangular pyramid structure has a square base and four isosceles triangular faces having the same dimension, adjacent rectangular pyramid structures sharing one edge, the included angle between adjacent rectangular pyramid structures being 60~120 degrees.

4. The light emitting diode as claimed in claim 1, wherein, the cone-shaped structures are triangular pyramid structures, hexagonal pyramid structures, octagonal pyramid structures or circular cone structures.

5. The light emitting diode as claimed in claim 1, wherein, the light emitting diode further comprises a buffer layer between the sapphire substrate and the epitaxial layer, a material of the buffer layer being gallium nitride.

6. The light emitting diode as claimed in claim 1, wherein, the light emitting diode further comprises a transparent conductive layer on the capping layer.

7. The light emitting diode as claimed in claim 6, wherein, the light emitting diode further comprises a first electrode, a second electrode, and an opening extending into the epitaxial layer, wherein,
the first electrode is on the transparent conductive layer to connect the transparent conductive layer to a positive power terminal;
the second electrode is in the opening to connect the epitaxial layer to a negative power terminal.

8. The light emitting diode as claimed in claim 1, wherein, a material of the epitaxial layer is N-doped gallium nitride: the active layer comprises a multiple-quantum-well active layer, a material of the multiple-quantum-well active layer being indium-gallium nitride; a material of the capping layer is P-doped gallium nitride.

9. A fabrication method of light emitting diode, comprising:
providing a sapphire substrate;
etching the sapphire substrate to form a plurality of cone-shaped structures, the cone-shaped structures being regularly and uniformly distributed;
forming an epitaxial layer, an active layer and a capping layer on the cone-shaped structures in sequence, so that the cone-shaped structures face the active layer to enhance the reflection of light, such that most light originally emitted from the active layer towards a bottom surface of the light emitting diode reverses its direction and is emitted from a top surface of the light emitting diode.

10. The fabrication method as claimed in claim 9, wherein, the cone-shaped structures are rectangular pyramid structures.

11. The fabrication method as claimed in claim 10, wherein, the rectangular pyramid structure has a square base and four isosceles triangular faces having a same dimension, adjacent rectangular pyramid structures sharing one edge, an included angle between adjacent rectangular pyramid structures being 60~120 degrees.

12. The fabrication method as claimed in claim 9, wherein, the cone-shaped structures are triangular pyramid structures, hexagonal pyramid structures, octagonal pyramid structures or circular cone structures.

13. The fabrication method as claimed in claim 9, wherein, the etching to form the plurality of cone-shaped structures comprises:
   forming a plurality of photoresist blocks on the sapphire substrate;
   baking the photoresist blocks so that surfaces of the photoresist blocks become arc-shaped or cone-shaped under force of surface tension at a temperature higher than a glass melting temperature of a photoresist;
   performing an inductive coupled plasma etch process by using the photoresist blocks after baking as mask until the photoresist blocks after baking are completely etched, wherein, a ratio between an etch rate of the sapphire substrate and an etch rate of the photoresist blocks after baking is in a range of 1~1.8.

14. The fabrication method as claimed in claim 13, wherein, a cross section of the photoresist block is triangular, rectangular, hexagonal, octagonal or circular.

15. The fabrication method as claimed in claim 13, wherein, in the inductive coupled plasma etch process, an etching gas is a mixture of boron trichloride, helium gas and argon gas, a cavity pressure being 50 mTorr~2 Torr, a plate power being 400 W~600 W, a coil power being 300 W~500 W.

16. The fabrication method as claimed in claim 13, wherein, the photoresist blocks are baked under a temperature of 120° C.~250° C.

17. The fabrication method as claimed in claim 9, wherein, a material of the epitaxial layer is N-doped gallium nitride; the active layer comprises a multiple-quantum-well active layer, a material of the multiple-quantum-well active layer being indium-gallium nitride; a material of the capping layer is P-doped gallium nitride.

18. The fabrication method as claimed in claim 9, wherein, before the formation of the epitaxial layer, further comprises: growing a gallium nitride film on the sapphire substrate to form a buffer layer.

19. The fabrication method as claimed in claim 9, wherein, after the formation of the capping layer, further comprises: forming a transparent conductive layer on the capping layer.

20. The fabrication method as claimed in claim 9, wherein, after the formation of the transparent conductive layer, further comprises:
   forming a first electrode on the transparent conductive layer;
   forming an opening extending into the eptaxial layer;
   forming a second electrode in the opening.

* * * * *

UNITED STATES PATENT AND TRADEMARK OFFICE
CERTIFICATE OF CORRECTION

| | | |
|---|---|---|
| PATENT NO. | : 8,704,227 B2 | Page 1 of 1 |
| APPLICATION NO. | : 13/059399 | |
| DATED | : April 22, 2014 | |
| INVENTOR(S) | : Deyuan Xiao et al. | |

It is certified that error appears in the above-identified patent and that said Letters Patent is hereby corrected as shown below:

In the Claims,

Column 8, Claim 1, line 11, delete "reversed" and insert --reverses--.

Signed and Sealed this
Sixteenth Day of December, 2014

Michelle K. Lee
*Deputy Director of the United States Patent and Trademark Office*